United States Patent [19]

Makino

[11] 3,993,946
[45] Nov. 23, 1976

[54] APPARATUS FOR MEASURING THE DIRECTION AND RELATIVE POSITION BETWEEN A BODY AND A PICK-UP USING A MAGNETORESISTIVE PICK UP

[75] Inventor: Yoshimi Makino, Fujisawa, Japan

[73] Assignee: Sony Corporation, Tokyo, Japan

[22] Filed: Dec. 4, 1974

[21] Appl. No.: 529,403

[30] Foreign Application Priority Data

Dec. 12, 1973 Japan.............................. 48-138987

[52] U.S. Cl. .............................. 324/34 D; 338/32 R
[51] Int. Cl.² ......................................... G01R 33/00
[58] Field of Search ................ 324/34 D, 34 PS, 45, 324/46; 338/32 R, 32 H; 340/174.1, 174.1 B, 174.1 C, 174.1 F

[56] References Cited
UNITED STATES PATENTS

| | | | |
|---|---|---|---|
| 3,331,045 | 7/1967 | Weiss et al. | 338/32 R |
| 3,426,270 | 2/1969 | Reid | 324/46 |
| 3,597,749 | 8/1971 | Uemura et al. | 324/34 D |
| 3,626,397 | 12/1971 | Uemura | 324/34 D |
| 3,691,502 | 9/1972 | Kataoka | 324/46 |

FOREIGN PATENTS OR APPLICATIONS

1,185,227   1/1965   Germany .......................... 324/34 D

Primary Examiner—Robert J. Corcoran
Attorney, Agent, or Firm—Hill, Gross, Simpson, Van Santen, Steadman, Chiara & Simpson

[57] ABSTRACT

An improved measurement system for determining the degree of out of synchronism or phase difference of a moving body carrying a row of magnets with respect to a reference signal. A pair of precisely spaced magnetoresistance elements are provided each having a plurality of stripes formed of a ferromagnetic material with an anisotropic characteristic. Each element has an AC power source connected across it, the two power sources being 90° out of phase. Positioned near the magnetoresistance elements is the row of magnets comprised of a plurality of magnet pairs having South pole ends abutting and forming a specific wavelength. As the row of magnets moves relative to the magnetoresistive elements, a changing magnetic flux causes resistance changes in the elements which in turn produces a modulation of the AC power sources which is sensed at the middles of the magnetoresistance elements. These modulated signals are combined to produce a signal whose phase is compared with a reference signal of the same frequency as the AC power sources.

5 Claims, 29 Drawing Figures

APPARATUS FOR MEASURING THE DIRECTION AND RELATIVE POSITION BETWEEN A BODY AND A PICK-UP USING A MAGNETORESISTIVE PICK UP

BACKGROUND OF THE INVENTION

1. Field of the Invention

This invention relates to a phase measurement system for a moving body having a row of magnets therein, and more particularly to phase measurement system for a magnetically controlled signal by which the phase difference of the magnetically controlled signal can be read out with high accuracy.

2. Description of the Prior Art

Figure 1:
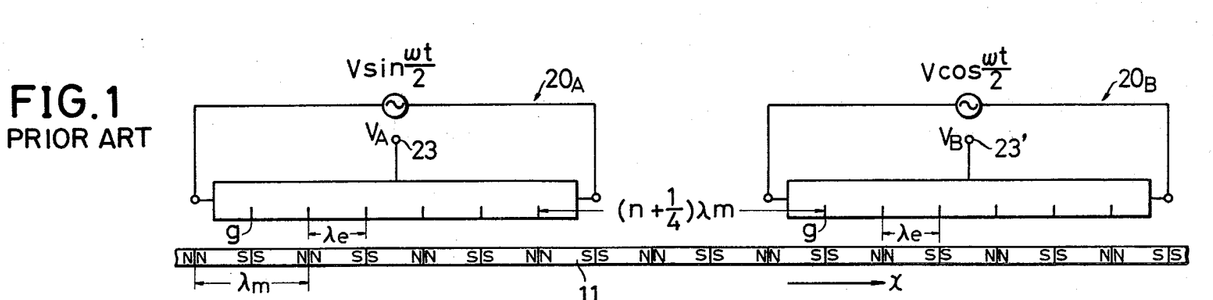
FIG. 1 is a schematic view illustrating the conventional measuring system for the magnetically controlled signal using multi-gap magnetic heads.

Multi-gap magnetic heads as shown in FIG. 1 have hitherto been used for the read-out of the length of phase difference of a magnetically controlled signal.

Referring to FIG. 1, a pair of multi-gap magnetic heads 20A and 20B has a plurality of gaps g and selectivity of wave length. The multi-gap magnetic heads 20A and 20B comprise a plurality of magnetic heads 20 (FIG. 2) connected in series with each other and at regular intervals. The magnetic head 20 has a lateral core 21 on which a coil 22 is wound.

The selectivity of wave length means the function to detect selectively signals with specific frequencies from a composite signal with different frequency components. When the multi-gap magnetic heads detect the repeated magnetic flux changes which are formed by the row of magnets, the selectivity of wave length means the function to detect selectively flux changes with wave lengths twice, four times, six times . . . . as long as the distance between the adjacent gaps of the multi-gap magnetic head.

When a normal magnetic head runs parallel to the row of magnets, the frequency and amplitude of the detected sine wave output vary with the running speed of the magnetic head. When the magnetic head stops, no output is obtained from the magnetic head.

Figure 2:
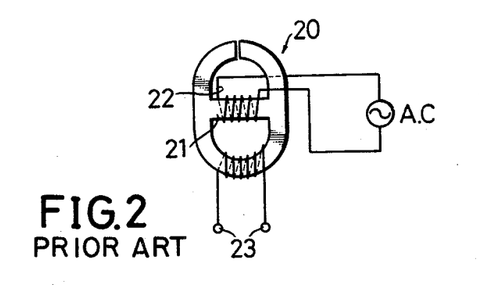
FIG. 2 is a schematic front view of a single magnetic head constituting the multi-gap magnetic head on FIG. 1.

In the prior art measurement system, an alternating voltage with the frequency $$\frac{f}{2}$$

is applied to the magnetic head 20 shown on FIG. 2. The alternating voltage is sufficient to almost saturate the magnetic head. Output with the frequency $f$ is always obtained from an output terminal 23. When the magnetic head 20 is stopped, output is obtained from the magnetic head 20 in response to the magnetic flux occurring at the stop position.

The multi-gap magnetic heads 20A and 20B are of a responding type magnetic flux. The distance between the multi-gap magnetic heads 20A and 20B is $$(n + \frac{1}{4}) \lambda m,$$

where $n = 0, 1, 2 \ldots$ and $\lambda m$ a wave length, as shown on FIG. 1. An alternating voltage $$V \sin \frac{\omega}{2} t$$

is applied to the one multi-gap magnetic head 20A. Another alternating voltage $$V \cos \frac{\omega}{2} t$$

shifted from the voltage $$V \sin \frac{\omega}{2} t$$

by 90° in phase, is applied to the other multi-gap magnetic head 20B. When the multi-gap magnetic heads 20A and 20B are displaced by $x$ from the position shown on FIG. 1, keeping the distance between the magnetic heads 20A and 20B, the following output voltages $V_A$ and $V_B$ are obtained from the output terminals 23 and 23':

$$V_A = h \cdot V \sin \omega t \cdot \cos \frac{2\pi}{\lambda m} x \quad (1)$$

$$V_B = h \cdot V \cos \omega t \cdot \sin \frac{2\pi}{\lambda m} x \quad (2)$$

$h$ in the above equations is a constant depending on the shapes of the multi-gap magnetic heads 20A and 20B, the gap loss, the selectivity of wave length and so on. The constant is determined by the distance $\lambda e$ between the adjacent gaps, the distance $$(n + \frac{1}{4}) \lambda m$$

between the multi-gap magnetic heads 20A and 20B, the wave length $\lambda m$ between the multi-gap magnetic heads 20A and 20B, the wave length $\lambda m$ of the recorded signals, and so on. The terms $$\cos \frac{2\pi}{\lambda m} x \text{ and } \sin \frac{2\pi}{\lambda m} x$$

in the above equations represent the changes of the amplitudes of the output voltages $V_A$ and $V_B$. The carrier wave $V \sin \omega t$ is amplitude-modulated by $$\cos \frac{2\pi}{\lambda m} x,$$

with respect to the output voltage $V_A$. The carrier wave $V \cos \omega t$ is amplitude-modulated by $$\sin \frac{2\pi}{\lambda m} x,$$

with respect to the output voltage $V_B$. The output voltage $V_A$ is added to the output voltage $V_B$, to form a magnetically controlled signal $V_P$.

$$V_P = V_A + V_B = h \cdot V \sin (\omega t + \frac{2\pi}{\lambda m} x) \quad (3)$$

If the displacement $x$ is an integral number of times as long as the wave length $\lambda m$, it can be read out by the selectivity of wave length, of the multi-gap magnetic heads 20A and 20B. When the displacement $x$ is not an integral number times as long as the wave length $\lambda m$, or when the multi-gap magnetic heads 20A and 20B stop at the position where the gaps $g$ deflect from the corresponding border lines of the adjacent magnets, the deflection cannot be read out by the selectivity of wave length.

Figure 3:
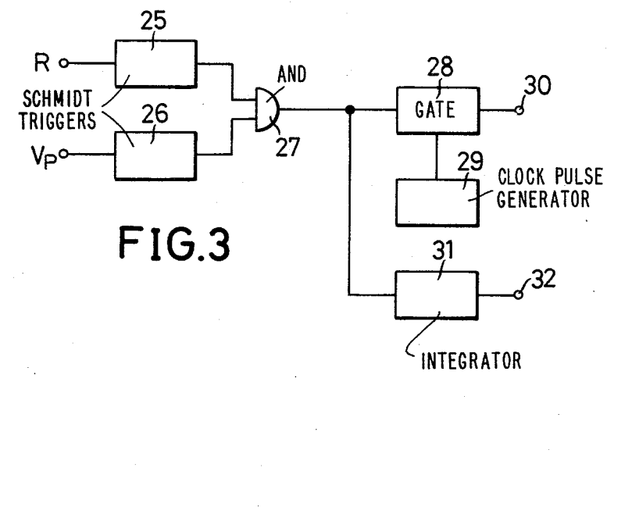
FIG. 3 is a block diagram of a phase difference circuit used in the conventional measuring system.

A phase difference represented by a length shorter than the wave length $\lambda m$ can be measured by the measurement method using a circuit shown on FIG. 3.

Figure 4:
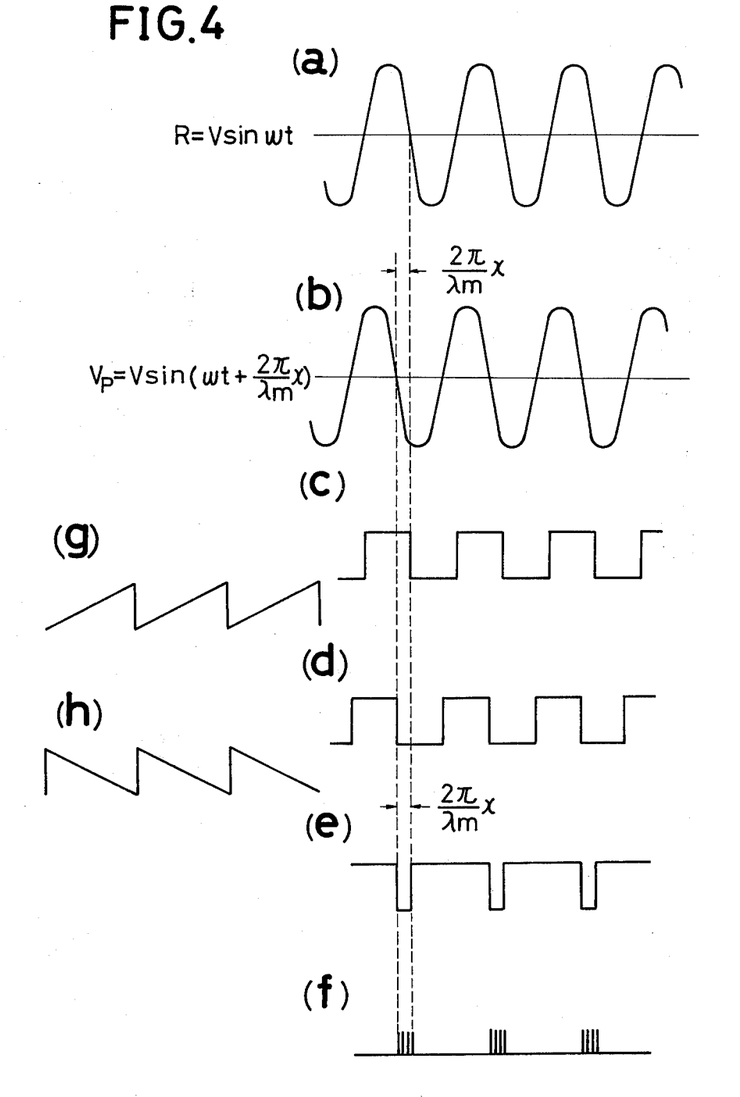

In FIG. 3, a reference signal R is applied to a Schmidt circuit 25. A signal $V \sin \omega t$ is used as the reference signal R which is shown on FIG. 4(a). A rectangular wave shown on FIG. 4(c) is obtained from the Schmidt circuit 25. The wave form of the voltage $V_P$ of the equation (3) is shown on FIG. 4(b). The voltage $V_P$ is shifted from the reference signal R by $$\frac{2\pi}{\lambda m} x$$

in phase. It is applied to another Schmidt circuit 26. A rectangular wave shown on FIG. 4(d) is obtained from the Schmidt circuit 26. It is shifted from the rectangular wave of FIG. 4(c) by $$\frac{2\pi}{\lambda m} x$$

in phase. The rectangular waves of FIG. 4(c) and FIG. 4(d) are applied to an AND circuit 27. Pulses with the width $$\frac{2\pi}{\lambda m} x$$

are obtained from the AND-circuit 27 (FIG. 4(e)). The pulses are applied to a gate circuit 28, as gate signals. While the pulse is applied to the gate circuit 28, clock pulses from a clock pulse generator 29 can pass through the gate circuit 28. Accordingly, output shown on FIG. 4(f) is obtained from an output terminal 30 of the gate circuit 28. The distance between the adjacent clock pulses is a measurable unit of the phase difference represented as some fraction of the wavelength $\lambda m$. Accordingly, the length corresponding to the phase difference $$\frac{2\pi}{\lambda m} x$$

can be measured by the counting of the number of the clock pulses during one gate interval.

In FIG. 3, an integrator 31 functions to detect the direction of the movement of the multi-gap magnetic heads 20A and 20B. When the multi-gap magnetic heads 20A and 20B are moved in the right direction on FIG. 1, a saw-toothed wave shown on FIG. 4(g) is obtained from an output terminal 32 of the integrator 31. When the multi-gap magnetic heads 20A and 20B are moved in the left direction on FIG. 1, a saw-toothed wave shown on FIG. 4(h) is obtained from the output terminal 32 of the integrator 31. The saw-toothed wave of FIG. 4(g) is of acclivity. The saw-toothed wave of FIG. 4(h) is of declivity. Positive and negative pulses are obtained with the differentiations of the saw-toothed waves of FIG. 4(g) and FIG. 4(h), respectively. Thus, the direction of the movement of the multi-gap magnetic heads 20A and 20B can be detected, and thus, the direction of phase change.

In the above-mentioned measurement method using the multi-gap magnetic heads, many disadvantages are present. The coils 22 are required for the magnetic heads 20. For that reason, the arrangements of the measuring apparatus are complicated. The measuring apparatus is apt to be affected by the change of temperature and the external magnetic field. Since the frequency of the reference voltage is double the coil driving voltage, a frequency multiplying or dividing means is necessary.

SUMMARY OF THE INVENTION

An object of this invention is to provide a phase measuring system for a moving body having magnets thereon by which the disadvantages of the conventional measurement system can be removed.

Another object of this invention is to provide a measuring system for a moving body with magnets thereon in which output signals from the measuring system are less distorted.

A further object of this invention is to provide a phase measuring system for a magnetically controlled signal in which the phase measurement is more accurate than in the conventional phase measuring system using multi-gap magnetic heads.

Another object of this invention is to provide a phase measurement system for a magnetically controlled signal in which the frequency of the reference signal is the same as the AC voltage used to drive the magnetoresistance elements.

A further object of this invention is to simplify the measurement apparatus and design the system to be independent of temperature and external magnetic field changes.

In accordance with an aspect of this invention, a phase measurement system for a magnetically controlled signal comprises:

a. a row of magnets for creating a magnetically controlled signal when the magnets are in relative motion to a measuring system;

b. a pair of multiple magnetoresistance elements, spaced from each other by a predetermined distance and positioned close to the row of magnets, the multiple magnetoresistance element comprising first and second magnetoresistance stripe groups formed of ferromagnetic material, connected electrically in series with each other and spaced from each other by a predetermined distance, in which the magnetoresistance stripes are connected electrically in series with each other, spaced from each other by a predetermined distance;

c. output terminals connected to connecting points of the first and second magnetoresistance stripe groups;

d. current supply terminals connected to both ends of the multiple magnetoresistance elements;

e. an AC power source connected to the current supply terminals of the one multiple magnetoresistance element; and f. another AC power source supplying a reference voltage shifted from the voltage of the first AC power source, by 90° in phase.

The above, and other objects, features and advantages of the invention, will be apparent in the following detailed description of illustrative embodiments thereof which is to be read in connection with the accompanying drawings.

BRIEF DESCRIPTION OF THE DRAWINGS

FIG. 4 (a) to FIG. 4 (h) are wave forms useful in explaining the operation of the conventional measurement system;

FIGS. 18 (a), (b) and (c) are schematic views illustrating measurement systems for a magnetically controlled signal according to further embodiments of this invention.

DESCRIPTION OF THE PREFERRED EMBODIMENTS

A magnetoresistance element with a novel construction was disclosed in application, Ser. No. 487,282, filed July 10, 1974, and assigned to the same assignee as the present invention. Moreover, multiple magnetoresistance element with the selectivity of wave length, using the magnetoresistance element, was disclosed in application, Ser. No. 523,339, filed Nov. 13, 1974, and assigned to the same assignee as the present invention.

First, the outlines of the above-mentioned two Patent Applications will be described.

Figure 5:
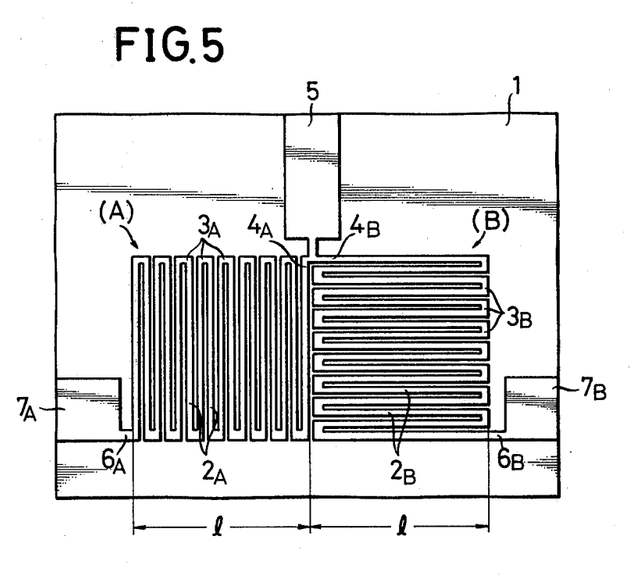
FIG. 5 is a plan view of a magnetoresistance element useful in explaining a measurement system according to this invention.

FIG. 5 shows the construction of the magnetoresistance element. Films of stripes (A) and (B) formed of ferromagnetic material having an anisotropic effect of magnetoresistance, such as nickel-cobalt, are formed on a base plate 1 formed of glass. The stripes (A) and (B) are deposited on the base plate 1 by the vacuum evaporation method. Or the stripes (A) and (B) may be formed on the base plate 1 by an etching method, after the film of the ferromagnetic material has been deposited on the whole surface of the base plate 1. The stripes (A) and (B) comprise a plurality of main current path portions 2A and 2B, and a plurality of connecting portions 3A and 3B. The main current path portions 2A are perpendicular to the main current path portions 2B. One end 4A of the last of the main current path portions 2A is connected to one end 4B of the first of the main current path portions 2B. Accordingly, the stripes (A) and (B) are connected in series with each other. An output terminal 5 is connected to a connecting point of the stripes (A) and (B). A current supply terminal 7A is connected to one end 6A of the first of the main current path portions 2A, and another current supply terminal 7B is connected to one end 6B of the last of the main current path portions 2B.

Figure 6:
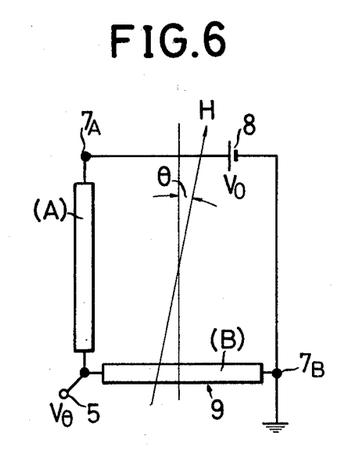
FIG. 6 is a schematic view illustrating a principle of the magnetoresistance element shown on FIG. 5.

Referring to FIG. 6, the current supply terminals 7A and 7B are connected to a power source 8. The one current supply terminal 7B is connected to the ground. Thus, a sensing circuit 9 for the direction of the magnetic field H can be obtained.

A magnetic field H sufficient to saturate the stripes (A) and (B) formed of ferromagnetic material is applied to the stripes (A) and (B) at an angle $\theta$ to the longitudinal direction of the main current path portions 2A of the stripe (A). Resistances $\rho_A$ and $\rho_B$ of the stripe (A) and (B) will be represented by the following equations:

$$\rho_A = \rho_\perp \sin^2\theta + \rho_\parallel \cos^2\theta \qquad (4)$$

$$\rho_B = \rho_\perp \cos^2\theta + \rho_\parallel \sin^2\theta \qquad (5)$$

where $\rho_\perp$ is a resistance of the ferromagnetic stripe (A) or (B) when saturated with a magnetic field perpendicular to the current-flowing direction of the ferromagnetic stripe (A) or (B), and $\rho_\parallel$ a resistance of the ferromagnetic stripe when saturated with a magnetic field parallel with the current-flowing direction of the ferromagnetic stripe (A) or (B).

A voltage $V_\theta$ at the output terminal 5 will be represented by $$V_\theta = \frac{\rho_B}{\rho_A + \rho_B} \cdot V_o \qquad (6)$$

where $V_o$ is a voltage of the power source 8.

By substitution of the equations (4) and (5), $$\frac{V_o}{2} - \frac{\Delta\rho \cos 2\theta}{2(\rho_\parallel + \rho_\perp)}$$

where $\Delta\rho = \rho_\parallel - \rho_\perp$

In the equation (7), the first term represents a standard voltage $$V_s ) V_s = \frac{V_o}{2} ),$$

and the second term a change of the output voltage $\Delta V_\theta$.

The second term $V_\theta$ is converted into $$\Delta V_\theta = - \frac{\Delta\rho}{4\rho_o} \cdot \cos 2\theta \cdot V_o \qquad (8)$$

where $2\rho_o = \rho_\parallel + \rho_\perp$ and $\rho_o$ is a resistance of the ferromagnetic stripe (A) or (B) when no magnetic field is applied to the ferromagnetic stripe (A) or (B).

Figure 7:
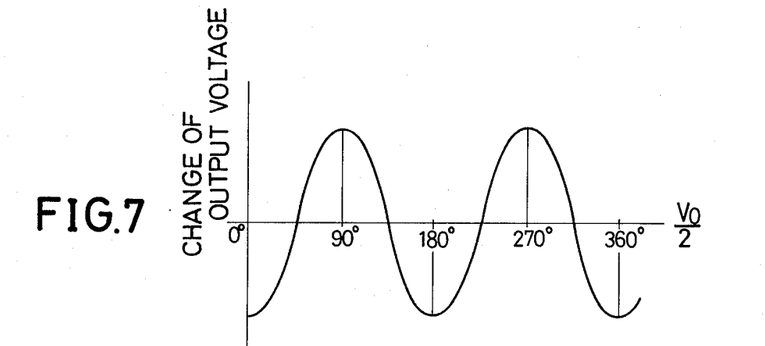
FIG. 7 shows the relationship between the change of the output voltage of the magnetoresistance element and the direction of the magnetic field applied to the magnetoresistance element.

As shown on FIG. 7, the change of the output voltage is minimum at the directions 0° and 180° of the magnetic fields H, and it is maximum at the directions 90° and 270° of the magnetic fields H. The change of the output voltage is a sine-wave.

Figure 8:
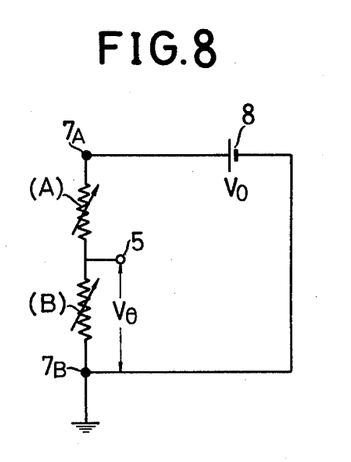
FIG. 8 is a circuit diagram equivalent to FIG. 5.

FIG. 8 shows a circuit equivalent to FIG. 5. Since the resistances of the ferromagnetic stripes (A) and (B) vary with the direction of the magnetic field H, the ferromagnetic stripes (A) and (B) can be regarded as variable resistors.

Next, a multiple magnetoresistance element will be described having the above-mentioned selectivty of wave length and of a shape utilized in the preferred embodiment described later.

Figure 9:
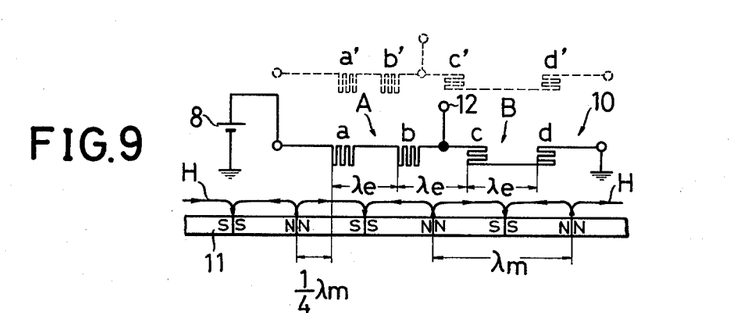
FIG. 9 is a schematic view of a multiple magnetoresistance element according to one embodiment of the invention.

FIG. 9 shows the relationship between a preferred embodiment of a multiple magnetoresistance element 10 and repeated magnet pairs 11 of a row of magnets. The repeated magnet pairs are formed of numerous small magnets. The length of the adjacent two magnets, namely the wave length of the repeated magnetic flux changes is $\lambda m$. In the multiple magnetoresistance element 10, a magnetoresistance stripe group A is electrically connected in series with another magnetoresistance stripe group B. In the group A, the two ferromagnetic stripes (A) shown on FIG. 5 sre electrically connected in series with each other. The distance between the two ferromagnetic stripes (A) is $$\lambda_r \left(= \frac{\lambda m}{2}\right).$$

Similarly, in the group B, the two ferromagnetic stripes (B) shown on FIG. 5 are electrically connected in series with each other. The distance between the two ferromagnetic stripes (B) is $\lambda_e$. Also the distance between the right ferromagnetic stripe $b$ of the group A and the left ferromagnetic stripe $c$ of the group B is $\lambda_e$. An output terminal 12 is connected to a connecting portion of the groups A and B. The power source 8 is connected to the left ferromagnetic stripe $a$ of the group A. The right ferromagnetic stripe $d$ of the group B is connected to the ground. In this embodiment, two ferromagnetic stripes (A) and (B) are used for the groups A and B, respectively. However, n-ferromagnetic stripes (A) and (B) may be used for the groups A and B, respectively, where $n = 2, 3, 4 \ldots$ When the magnetoresistance stripes $a$, $b$, $c$ and $d$ are positioned close to the center portions of the magnets creating the magnet pairs 11, the magnetic fields H are applied to the magnetoresistance stripes $a$, $b$, $c$ and $d$ at the angles 90°, 270°, 90° and 270°, respectively, so that the maximum output voltage is obtained from the output terminal 12 of the multiple magnetoresistance element 10 (FIG. 7).

If the distances between magnetoresistance stripes $a'$ and $b'$, $b'$ and $c'$, and $c'$ and $d'$ are not equal to $$\frac{\lambda m}{2},$$

as shown by the dotted line on FIG. 9, the output voltage is decreased. Accordingly, the multiple magnetoresistance element 10 can have the selectivity of wave length and it can read out accurately the length of three waves, if $$\lambda_r = \frac{\lambda m}{2}.$$

Generally, if $$\lambda_r = \frac{\lambda m}{2} k \ (k = 1, 2, 3, \ldots),$$

the magnetic fields H are applied to the magnetoresistance stripes $a$, $b$, $c$ and $d$ at the same angle or at the angles shifted by 180° from each other, so that the multiple magnetoresistance element can obtain the selectivity of wave length. The components of wave lengths, which can be read out by the multiple magnetoresistance element, are increased with the number of the magnetoresistance stripes. Accordingly, the accuracy of the measurement can be improved with the number of the magnetoresistance stripes.

Figure 10:
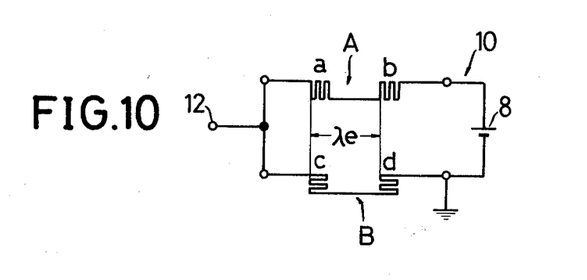
FIG. 10 to FIG. 12 are schematic views of multiple magnetoresistance elements according to other embodiments of the invention.

FIG. 10 shows an alternative embodiment for shaping the multiple magnetoresistance element. The groups A and B are superimposed on each other through an insulating layer or a base plate.

Figure 11:
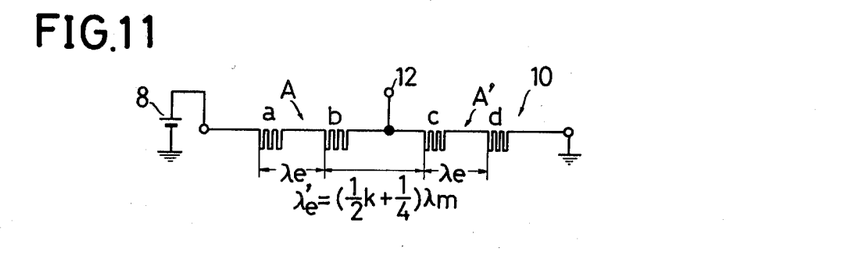
Figure 12:
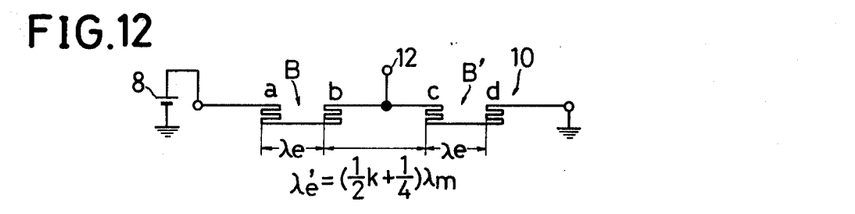

FIG. 11 and FIG. 12 show other shapes of the multiple magnetoresistance element.

Figure 13:
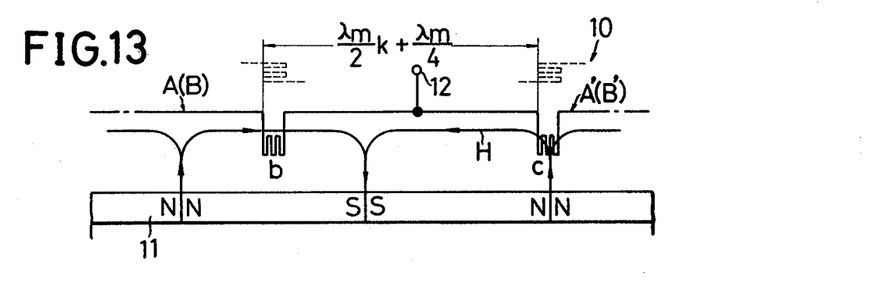
FIG. 13 shows the relationship between signal magnetic fluxes from a row of magnets and a multiple magnetoresistance element.

Only the type of the ferromagnetic stripe (A) is used in the alternative embodiment of FIG. 11. Groups A and A' are electrically connected in series with each other. Only the type of the ferromagnetic stripe (B) is used in the alternative embodiment of FIG. 12. Groups B and B' are electrically connected in series with each other. The distance $\lambda_e'$ between the groups A and A', or the groups B and B', is equal to $$\left(\frac{1}{2} k + \frac{1}{4}\right) \lambda m$$

as shown on FIG. 11 and FIG. 12. When the magnetic field H is applied to the magnetoresistance stripe $b$ of the group A at the angle 90°, it is also applied to the magnetoresistance stripe $c$ of the group A' at the angle 0° (FIG. 13). The magnetic field H is applied to the magnetoresistance stripe $c$ of the type of the ferromagnetic stripe (B), at the angle 90° or 270°. Accordingly, the magnetic field H is applied to the whole multiple magnetoresistance element 10 of FIG. 9 at the angle 90° or 270°. The maximum output voltage can be obtained from the output terminal 12 and the multiple magnetoresistance element 10 can have the selectivity of wave length.

Figure 14:
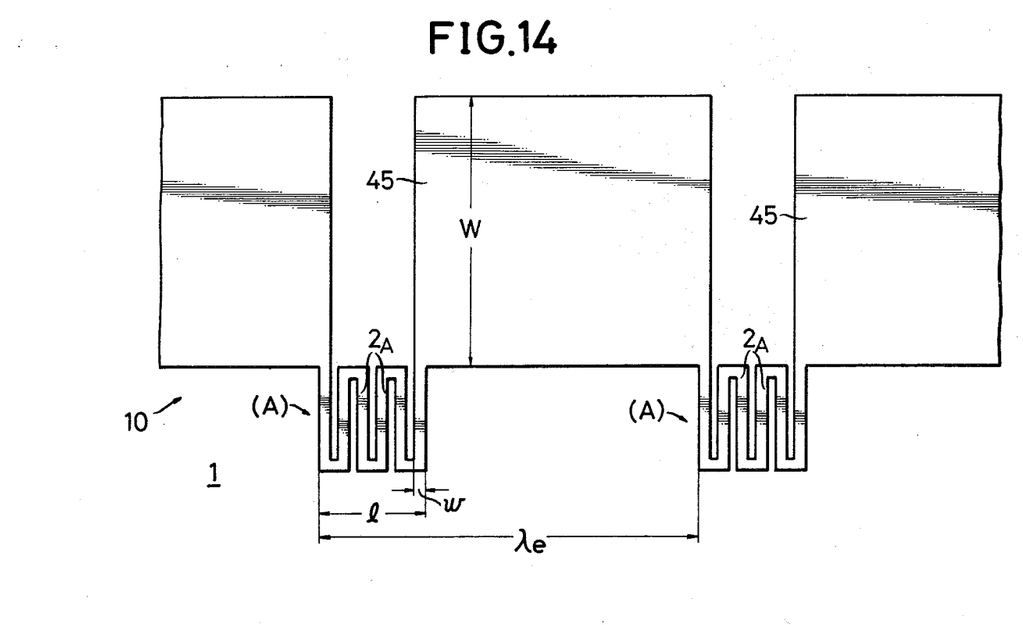
FIG. 14 is an enlarged plan view of a part of a multiple magnetoresistance element.

FIG. 14 is an enlarged plan view of a part of the multiple magnetoresistance element 10 which is illustrated in FIG. 11. Connecting portions 45 of the magnetoresistance stripes (A) are formed of ferromagnetic films. The width W of the connecting portions 45 is so large that the resistance of the connecting portion 45 does not vary with the external magnetic field. The width W is practically about ten times as large as the width $w$ of the main current path portion 2A.

Figure 15:
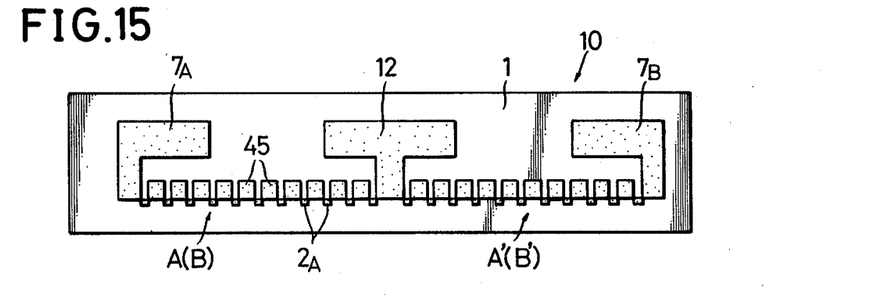
FIG. 15 is a plan view of a multiple magnetoresistance element.

FIG. 15 shows a plan view of the layout of the multiple magnetoresistance element 10 as used in the preferred embodiment. Two groups A or B and A' or B' are formed on the base plate 1. The groups A or B and A' or B' comprise ten magnetoresistance stripes, respectively, which are connected to each other by the connecting portions 45. Moreover, the current supply terminals 7A and 7B, and the output terminal 12 are formed on the base plate 1.

In this invention, two multiple magnetoresistance elements as above-mentioned, are used.

A preferred embodiment of this invention will now be described in detail.

Figure 16:
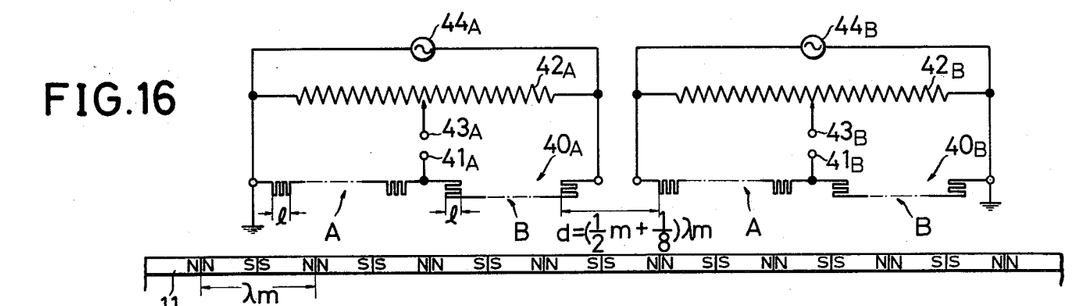
FIG. 16 is a schematic view illustrating a measurement system for a magnetically controlled signal according to one embodiment of this invention.

In FIG. 16, output terminals 41A and 41B are connected to multiple magnetoresistance elements 40A and 40B. Parallel resistors 42A and 42B having movable contacts 43A and 43B form bridges together with the multiple magnetoresistance elements 40A and 40B. An AC power source 44A of a voltage $V \sin \omega t$ is connected to the multiple magnetoresistance element 40A. Another AC power source 44B of a voltage $V \cos \omega t$ shifted from the voltage $V \sin \omega t$ by 90° in phase is connected to the multiple magnetoresistance element 40B. The one multiple magnetoresistance element 40A is separated from the other multiple magnetoresistance element 40B by a distance $$d = (\frac{1}{2} m + \frac{1}{8})\lambda m,$$

where $m = 0, 1, 2, 3, \ldots$ The distance $d$ is between the last magnetoresistance stripe of the multiple magnetoresistance element 40A and the first magnetoresistance stripe of the multiple magnetoresistance element 40B, as shown on FIG. 16.

Output voltages $V_A$ and $V_B$ from the output terminals 41A and 41B are obtained in the following manner. Directions of the composite magnetic fluxes are calculated with respect to ferromagnetic stripes A and B. Accordingly, the whole resistances $\rho_{A0}$ and $\rho_{B0}$ varying with the directions of the composite magnetic fluxes are obtained with respect to the ferromagnetic stripes A and B. The output voltage $V_A$ and $V_B$ are represented by the following equations:

$$V_A = \frac{\rho_{B0}}{\rho_{A0} + \rho_{B0}} \cdot V \sin \omega t = \frac{V \sin \omega t}{2} - D \cdot V$$

$$\sin \omega t \cdot \cos (\frac{2\pi}{\lambda m} \cdot 1 + \frac{4\pi}{\lambda m} x) \quad (9)$$

$$V_B = \frac{\rho_{B0}}{\rho_{A0} + \rho_{B0}} \cdot V \cos \omega t = \frac{V \cos \omega t}{2} - D \cdot V$$

$$\cos \omega t \cdot \sin (\frac{2\pi}{\lambda m} \cdot 1 + \frac{4\pi}{\lambda m} x) \quad (10)$$

where 1 represents the width of the ferromagnetic stripes (A) or (B) and D a constant on the multiple ferromagnetic element 40A or 40B corresponding to the constant $h$ in the equations (6) and (7).

The first terms in the equations (9) and (10) represent reference voltages, but they are cancelled by the differential functions of the bridges including the parallel resistors 42A and 42B. Accordingly, output voltages $\Delta V_A$ and $\Delta V_B$ are obtained between the output terminals 41A and 43A, and between the output terminals 41B and 43B:

$$\Delta V_A = D \cdot V \sin \omega t \cdot \cos (\frac{2\pi}{\lambda m} \cdot 1 + \frac{4\pi}{\lambda m} x) \quad (11)$$

$$\Delta V_B = D \cdot V \cos \omega t \cdot \sin (\frac{2\pi}{\lambda m} \cdot 1 + \frac{4\pi}{\lambda m} x) \quad (12)$$

Those equations (11) and (12) correspond to the equations (1) and (2), respectively. The carrier waves $V \sin \omega t$ and $V \cos \omega t$ are amplitude-modulated with respect to the output voltages $\Delta V_A$ and $\Delta V_B$. The output voltage $\Delta V_B$ is subtracted from the output voltage $\Delta V_A$.

$$\Delta V_{A-B} = D \cdot V \sin (\omega t \frac{2\pi}{\lambda m} \cdot 1 - \frac{4\pi}{\lambda m} x) \quad (13)$$

Compared with the equation (3), the phase difference $$\frac{4\pi}{\lambda m} x$$

is twice as large as $$\frac{2\pi}{\lambda m} x.$$

Since $$\frac{2\pi}{\lambda m} 1$$

is constant, the measurement is performed with respect to the phase difference $$\frac{4\pi}{\lambda m} x.$$

In the measurement, the magnetically controlled signal $\Delta V_{A-B}$ is applied to the Schmidt circuit 26 and the voltage $V \sin \omega t$ is applied to the Schmidt circuit 25 as the reference signal R, in the measurement circuit of FIG. 3. Gate pulses with the width $$(\frac{2\pi}{\lambda m} \cdot 1 + \frac{4\pi}{\lambda m} x)$$

are obtained from the AND circuit 27.

Figure 17:
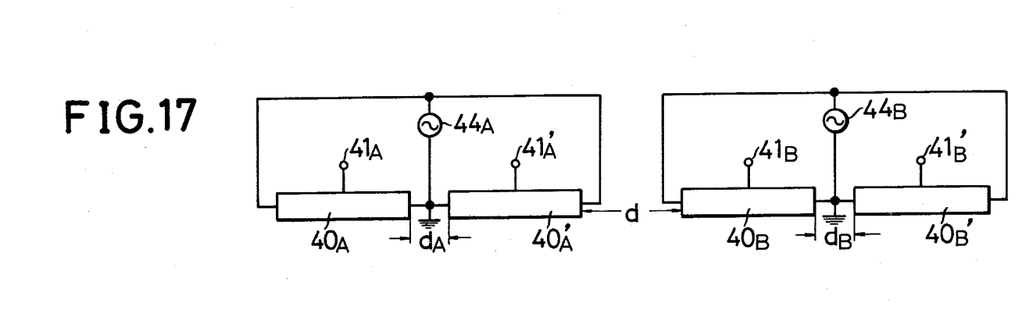
FIG. 17 is a schematic view illustrating a measuring system for a magnetically controlled signal according to another embodiment of this invention.

FIG. 17 shows an alternative embodiment of this invention. Multiple magnetoresistance elements 40A' and 40B' form bridges together with the multiple magnetoresistance elements 40A and 40B, instead of the parallel resistors 42A and 42B of FIG. 16. The first terms in the equations (9) and (10) can be cancelled, as in the first embodiment of FIG. 16.

Figure 18:
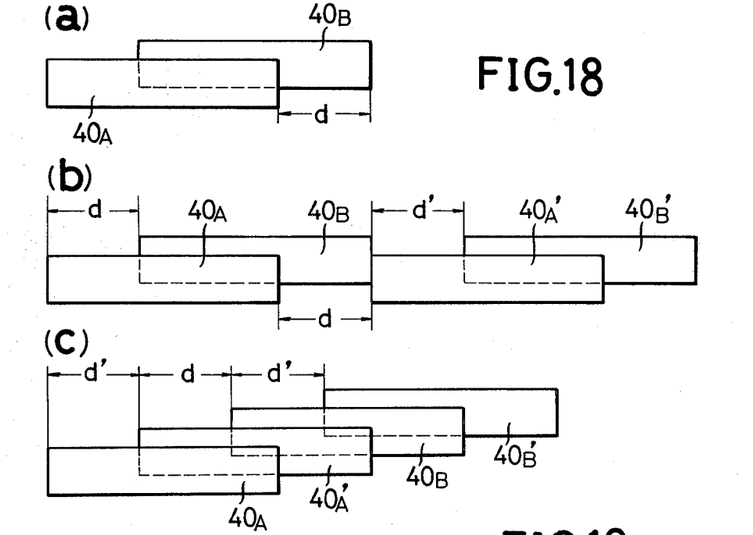

FIGS. 18 (a), (b) and (c) show other alternative embodiments of this invention. In the embodiments, the multiple magnetoresistance elements 40A and 40B of FIG. 11 or FIG. 12 can be employed. One multiple magnetoresistance element is partly superimposed on the other multiple magnetoresistance element.

In the alternative embodiment of FIG. 18 (a), the not-shown parallel resistors 42A and 42B form the bridges together with the multiple magnetoresistance elements 40A and 40B, as in the embodiment of FIG. 16. In the embodiments of FIGS. 18 (b) and (c), the multiple magnetoresistance elements 40A' and 40B' form the bridges together with the multiple magnetoresistance elements 40A and 40B, as in the embodiment of FIG. 17. In FIG. 18 (a), (b) and (c), $$d = (\frac{1}{2} m + \frac{1}{8})\lambda m \text{ and } d' = \lambda'_e = (\frac{1}{2} k + \frac{1}{4})\lambda m,$$

where $m$ and $k = 0, 1, 2, 3 \ldots$ The connections are the same in the embodiments of FIG. 16 and FIG. 17.

Figure 19:
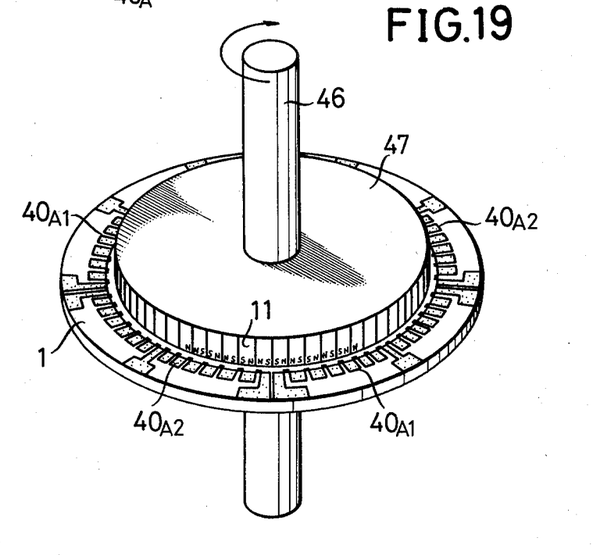
FIG. 19 is a perspective view of a rotary magnetic scale to which the one embodiment of this invention is applied.

FIG. 19 shows a preferred use of the invention. A rotary drum having a row of magnets surrounding the periphery and a multiple magnetoresistance element are combined.

In FIG. 19, a rotary drum 47 is fixed on a shaft 46. A stationary annular base plate 1 is arranged concentrically with the rotary drum 47. The row of magnets 11 is formed on the peripheral surface of the rotary drum 47. Patterns of multiple magnetoresistance elements 40A$_1$ and 40A$_2$ are formed on the upper surface of the annular base plate 1. The patterns are positioned close to the row of magnets 11. The multiple magnetoresistance elements 40A$_1$ and 40A$_2$ are connected to each other in such a manner as in the embodiment of FIG. 17. Thus, the phase angle of rotation of the rotary drum 47 can be detected.

In the invention as above-mentioned, no energizing coil is required in contrast to the conventional multi-gap magnetic heads and so the construction is simple. Since the frequency of the output voltage is twice as high as the frequency of the input voltage applied to the energizing coil in the conventional multi-gap magnetic heads, the reference signal R must be separately provided. However, in the invention, the voltage from the AC power source can be used as the reference signal R as is. Since the voltage for the carrier wave is applied to a pure resistor, not to an energizing coil, the output is less distorted in this invention. Since the frequency is not limited, it is easy to design a circuit. Moreover, since the phase difference for the measurement is doubled $$( \tfrac{2\pi}{\lambda m} x \rightarrow \tfrac{4\pi}{\lambda m} x ),$$

the accuracy of the measurement is improved in the invention.

The magnetoresistance element is used in a saturated magnetic field. Accordingly, it is not affected by the external magnetic field, the non-uniform magnetic field from the row of magnets, or the like. Although the resistance of the magnetoresistance element varies with temperature, the changes of $\Delta\rho$ and $\rho_0$ are very small, since $\rho_\parallel$ and $\rho_\perp$ in the equation (4) are simultaneously changed with temperature. Consequently, the output voltage is not effected by temperature.

Although preferred and alternative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined in the appended claims.

I claim as my invention:

1. A measuring system for measuring direction of movement and the relative position between a body and a pick-up means, said body having a plurality magnets of equal lengths $$\tfrac{\lambda m}{2}$$

formed thereon with adjacent magnets opposite orientated, comprising:

said pick-up means including first and second magnetoresistance elements spaced from each other a predetermined distance $$( \tfrac{1}{2} m + \tfrac{1}{8} )\lambda m$$

where $m$ is an integer or zero and positioned close to said body, each of said magnetoresistance elements comprising first and second magnetoresistance stripe groups formed of ferromagnetic material, each of said stripe groups comprising an electrical conductor with a plurality of parallel sections with the first end of the first parallel section being an input and the second end connected to the adjacent second end of the second parallel section and the first end of the second parallel section connected to the first end of the third parallel section and so on to form a stripe group and the second end of the last parallel section furnishing an output, said first and second groups electrically connected in series with each other and spaced from each other by a distance $$\tfrac{\lambda m}{2},$$

first and second resistors connected in parallel with said first and second elements,
a first AC power source connected in parallel with said first element,
a second AC power source having a voltage shifted from the voltage of said first AC power source by 90° in phase and said second AC power source connected in parallel with said second element,
a first one of a first pair of output terminals connected at the junction point between said first and second stripe groups of said first element,
a second one of said first pair of output terminals connected to an intermediate point on said first resistor,
a first one of a second pair of output terminals connected at the junction between said first and second stripe groups of said second element,
a second one of said second pair of output terminals connected to an intermediate point on said second resistor, and
means for subtracting the outputs of said first and second pairs of output terminals to produce an output indicative of the direction and amount of movement between said body and said pick-up.

2. A measuring system for measuring direction of movement and the relative position between a body and a pick-up means, said body having a plurality magnets of equal lengths $$\tfrac{\lambda m}{2}$$

formed thereon with adjacent magnets oppositely orientated, comprising:

said pick-up means including first and second magnetoresistance elements spaced from each other a predetermined distance $$\left(\frac{1}{2}m + \frac{1}{8}\right)\lambda m$$

where m is zero or an integer, and positioned close to said body, each of said magnetoresistance elements comprising first and second magnetoresistance stripe groups formed of ferromagnetic material, each of said stripe groups comprising an electrical conductor with a plurality of parallel sections with the first end of the first parallel section being an input and the second end connected to the adjacent second end of the second parallel section and the first end of the second parallel section connected to the first end of the third parallel section and so on to form a stripe group and the second end of the last parallel section furnishing an output, said first and second groups electrically connected in series with each other and spaced from each other by a distance $$\frac{\lambda m}{2},$$

a first AC power source connected from the junction point between said first and second stripe groups of said first element and to the other sides of said first and second stripe groups of said first element, a second AC power source having a voltage shifted from the voltage of said first AC power source by 90° in phase, said second AC power source being connected from the junction point of said first and second stripe groups of said second element and to the other sides of said first and second stripe groups of said second element, a first pair of output terminals respectively connected to said first and second stripe groups of said first element, a second pair of output terminals respectively connected to said first and second stripe groups of said second element, and means for subtracting the outputs of said first and second pairs of output terminals to produce a signal indicative of direction and amount of movement between said body and said pick-up.

3. A measuring system for measuring direction of movement and the relative position between a body and a pick-up means, said body having a plurality magnets of equal lengths $$\frac{\lambda m}{2}$$

formed thereon with adjacent magnets oppositely orientated, comprising:

said pick-up means including first and second magnetoresistance elements spaced from each other a predetermined distance $$\frac{\lambda m}{2}$$

and positioned close to said body, each of said magnetoresistance elements comprising first and second magnetoresistance stripe groups formed of ferromagnetic material, each of said stripe groups comprising an electrical conductor with a plurality of parallel sections with the first end of the first parallel section being an input terminal and the second end connected to the adjacent second end of the second parallel section and the first end of the second parallel section connected to the first end of the third parallel section and so on to form a stripe group and the second end of the last parallel section furnishing an output, said first and second groups electically connected in series with each other and spaced from each other by said predetermined distance $$\frac{\lambda m}{2},$$

said first and second magnetoresistance elements connected in series and the sections of one element at right angles to the sections of the other element, an output terminal connected to the junction formed between said first and second magnetoresistance elements, and a current supply connected to ends of said magnetoresistance elements.

4. A measuring system for measuring direction of movement and the relative position between a body and a pick-up means, said body having a plurality magnets of equal lengths $$\frac{\lambda m}{2}$$

formed thereon with adjacent magnets oppositely orientated, comprising:

said pick-up means including first and second magnetoresistance elements superimposed on each other and positioned closed to said body, each of said magnetoresistance elements comprising first and second magnetoresistance stripe groups formed of ferromagnetic material, each of said stripe groups comprising an electric conductor with a plurality of parallel sections with the first end of the first parallel section being an input terminal and the second end connected to the adjacent second end of the second parallel section and the first end of the second parallel section connected to the first end of the third parallel section and so on to form a stripe group and the second end of the last parallel section furnishing an output, said first and second groups electrically connected in series with each other and spaced from each other by a predetermined distance $$\frac{\lambda m}{2},$$

the sections of said first and second elements at right angles to each other, an output terminal connected to the first ends of said first and second magnetoresistance elements, and a current supply connected to the second ends of said first and second magnetoresistance elements.

5. A measuring system for measuring direction of movement and the relative position between a body and a pick-up means, said body having a plurality magnets of equal lengths $$\frac{\lambda m}{2}$$

formed thereon with adjacent magnets oppositely orientated, comprising:

said pick-up means including first and second magnetoresistance elements spaced from each other a predetermined distance $$(\frac{1}{2}k + \frac{1}{4})\lambda m$$

where $k$ is an integer and positioned close to said body, each of said magnetoresistance elements comprising first and second magnetoresistance stripe groups formed of ferromagnetic material, each of said stripe groups comprising an electrical conductor with a plurality of parallel sections with the first end of the first parallel section being an input and the second end connected to the adjacent second end of the second parallel section and the first end of the second parallel section connected to the first end of the third parallel section and so on to form a stripe group and the second end of the last parallel section furnishing an output, said first and second groups electrically connected in series with each other and spaced from each other by a predetermined distance $$\frac{\lambda m}{2}$$

and the sections of said first and second groups parallel to each other, said first and second magnetoresistance elements connected in series, an output terminal connected to the junction formed between said first and second magnetoresistance elements, and a current supply connected to ends of said magnetoresistance elements.

* * * * *